United States Patent [19]

Redmer

[11] Patent Number: 5,552,699
[45] Date of Patent: Sep. 3, 1996

[54] METHOD AND APPARATUS FOR TESTING WIRES EXTENDING BETWEEN A SWITCH CABINET AND REMOTELY POSITIONED FIELD UNITS

[75] Inventor: Bernd Redmer, Wiesbaden, Germany

[73] Assignee: Technoserv GmbH, Holzstrasse, Germany

[21] Appl. No.: 211,543

[22] PCT Filed: Sep. 29, 1992

[86] PCT No.: PCT/EP92/02246

§ 371 Date: May 10, 1994

§ 102(e) Date: May 10, 1994

[87] PCT Pub. No.: WO93/07501

PCT Pub. Date: Apr. 15, 1993

[30] Foreign Application Priority Data

Oct. 8, 1991 [DE] Germany .................. 41 33 354.3

[51] Int. Cl.⁶ .................. G01R 19/00; G01R 31/02
[52] U.S. Cl. .................. 324/66; 324/539
[58] Field of Search .................. 324/66, 67, 538, 324/539; 379/25, 26; 340/825.06, 825.07, 825.36, 825.49

[56] References Cited

U.S. PATENT DOCUMENTS

| | | |
|---|---|---|
| 3,182,253 | 5/1965 | Dorsch . |
| 3,891,811 | 6/1975 | Miller . |
| 3,902,026 | 8/1975 | Rogers et al. .................. 324/66 |
| 4,916,444 | 4/1990 | King . |
| 4,937,529 | 6/1990 | O'Toole . |

*Primary Examiner*—Walter E. Snow
*Attorney, Agent, or Firm*—Townsend and Townsend and Crew

[57] ABSTRACT

In order to be able to check the wiring of buildings, in particular of control systems in buildings, in a simple manner, the present invention provides the measure of applying to all outputs or inputs of a switch cabinet which are provided with cables to be tested a digital address associated with the respective input or output. These addresses are associated with the respective field units, such as sensors or servomotors, in a reference list. For checking the wiring, the addresses of the inputs and outputs of the switch cabinet are read out at the field units via the cables connected thereto and, subsequently, they are associated with the respective field unit in an actual-address list. A comparison between the reference list and the actual-address list will then show whether there are any wiring defects and, if so, where these defects are.

9 Claims, 1 Drawing Sheet

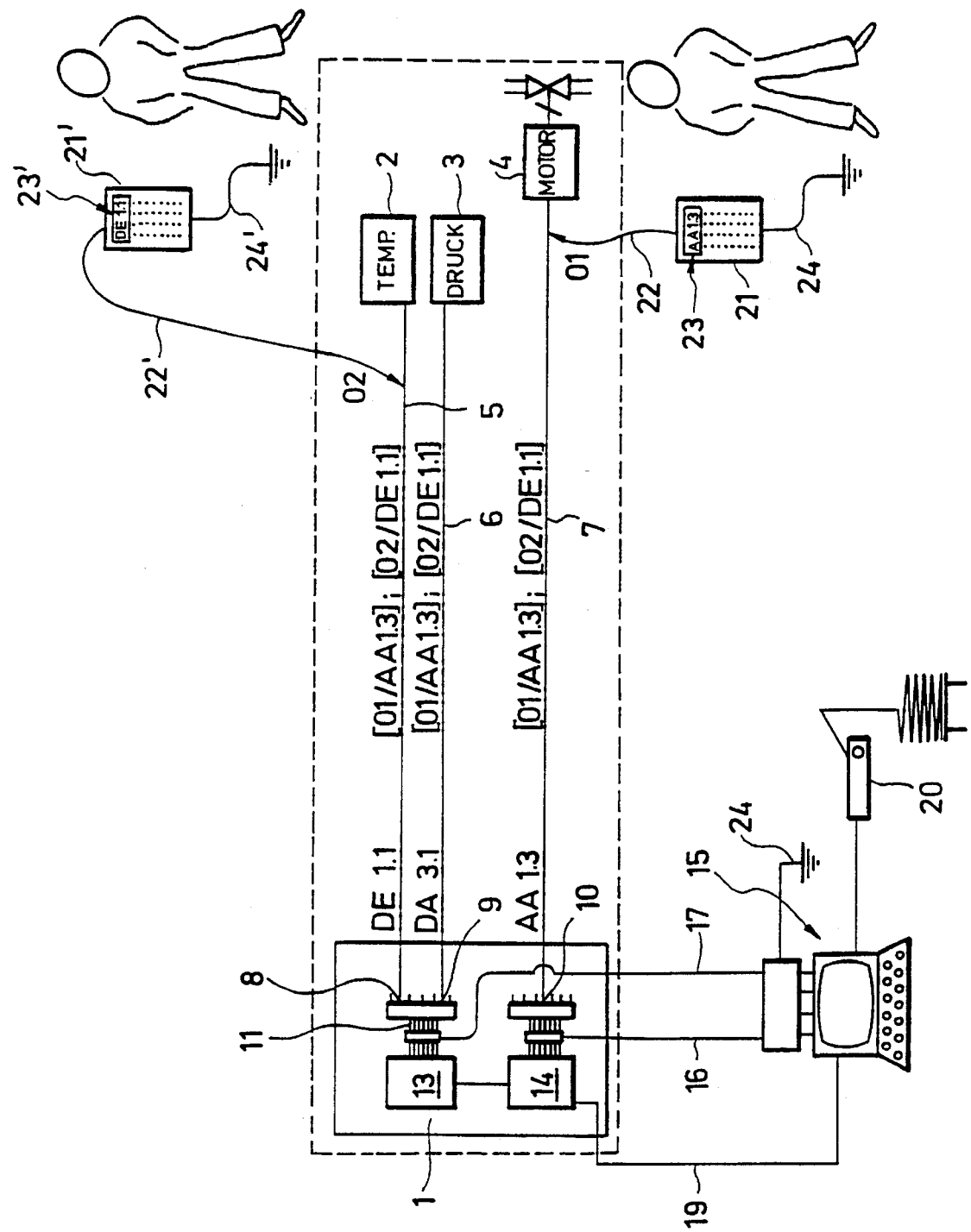

METHOD AND APPARATUS FOR TESTING WIRES EXTENDING BETWEEN A SWITCH CABINET AND REMOTELY POSITIONED FIELD UNITS

BACKGROUND OF THE INVENTION

When control systems are installed in buildings, it is necessary to check—after having connected all installed cables, which connect a field unit, such as a temperature sensor or a motor actuator, to a switch cabinet—each individual one of these cables so as to find out whether the connection in question is correct. The course of action which has hitherto been taken for this purpose is that a first person stands near the switch cabinet and a second person near the respective field unit. The cable is tested by means of a so-called "continuity test". The two persons can communicate with the aid of a radio set so that it is also possible to carry out function tests of the field units. In principle, it can, however, only be checked whether or not the wiring was carried out correctly. If it is observed that a specific cable does not lead to the associated field unit, it is impossible to find out by means of the known method where the mistake has been made or rather where the cable actually leads to. In medium-sized building projects, between 3000 and 10,000 cables are tested in this way. In view of the fact that two persons are required for carrying out the test, it is easily imaginable that the testing of the wiring alone already entails considerable personnel expenditure. This expenditure is increased enormously if errors occur in the form of confusions. In view of the fact that the known method is not suitable for finding out where the cables which have been exchanged by mistake lead to, it will normally be necessary to install the whole wiring again. Since the construction is already in an advanced stage in this phase, costs will again be incurred, which are much higher than those entailed by the original wiring.

A method of the type mentioned at the beginning is known from AU-B-0551 and also from the reference document U.S. Pat. No. 3,891,811. An automatic conductor pair identifier utilizes a field unit under the control of an operator and an office control unit coupled to a multiwire cable of wire pairs to be identified. Upon actuation of the field unit by an operator, a frequency tone signal is transmitted over a randomly selected wire pair to the office control unit that responds thereto to transmit a pulse code representing a number identifying the wire pair over the same wire pair. This pulse code is received by the field unit and converted into a digital display for operator evaluation. Basically, the field unit comprises an oscillator coupled to a transmitter for generating the inquiring frequency signal. A pulse code is received in the field unit by a level detector/receiver coupled to logic circuitry for decoding the pulse code to drive a units display and a tens display as part of a digital readout. In the office unit, there is also a receiver and level detector coupled to logic circuitry for responding to an inquiring frequency signal to set up a counting sequence. Upon positively identifying an inquiring frequency signal, the logic circuitry actuates a transmitter coupled to an oscillator for transmitting the pulse coded to the field unit over the same wire pair used by the field unit.

Another method is known from periodical Elektor Electronics, vol. 16 (1990), April, No. 177, GB-London, article "Wiring Allocation Tester". Both methods include the steps of applying digital signals to one end of the cable cores with the aid of a multiplexer, said digital signals being adapted to be read at the other end of the cable by means of an associated receiver. Due to the multiplex operation used, the number of cable cores to be tested is limited.

Hence, it is the object of the present invention to improve a method according to the generic clause and an associated apparatus in such a way that an arbitrary number of cables can be tested.

The present invention is directed to a method of testing the wiring between a switch cabinet and field units which are connected to the switch cabinet and which are installed at a large distance therefrom. The method includes applying to all inputs or outputs of the switch cabinet which are provided with a cable core to be tested a digital address which is associated with the respective input or output and associating the addresses with the respective field units in a reference list. The address of the inputs or outputs of the switch cabinet are then interrogated via the cable cores connected thereto and compared with the reference list. A ground current is initiated by a manual testing unit at the end of the cable core to be tested which is located on the side of the field unit. The ground current causes the digital address of the input or output associated with the cable to be tested to be applied at least to the cable core to be tested.

In accordance with the present invention, this object is achieved by the end of the cable core which is located on the side of the field unit having applied thereto an identifying signal associated with the respective manual testing unit, the initiated ground current causing the cores of all cables to have applied thereto a combination of the identifying signal and of the address of the switch cabinet input or output associated with the cable core to be tested.

The advantage of the method according to the present invention is that an arbitrary number of addresses can be generated by the testing computer. The addresses are not continuously applied to the cable cores to be tested, but they are only called up when the cable core to be tested is connected to earth at the cable core end located on the side of the field unit. In other words, the cable to be tested is used as a communication cable by sending first an initiating signal from the manual testing unit to the testing computer, whereupon the address of the associated input or output of the switch cabinet is applied at least to the cable to be tested. To make things easier, this address is applied to all cables, since the other cables are at this time not connected to the manual testing unit so that reading of the addresses will not be carried out there. Since signals need not be compared in the manual testing unit, but only one single signal is read, transmission errors of the type occurring in connection with multiplex systems cannot be caused.

On the basis of this mode of operation, it is possible to test the wiring to be checked by a plurality of manual testing units at the same time. Each manual testing unit transmits an identifying signal of its own, which differs from the other identifying signals. When a ground current has been initiated on the cable core to be tested, the testing computer will apply to all cable cores the address of the associated input or output of the switch cabinet supplemented by the identifying signal of the manual testing unit. The address reader of the manual testing unit can only read addresses which have been supplemented by the identifying signal of its own manual testing unit. If a plurality of manual testing units is used, the same cable cores may thus have applied thereto different addresses at the same time; these addresses can, however, only be read by the respective associated manual testing unit. This method is particularly advantageous if extensive wirings of buildings are to be tested, since it will then be possible that several persons simultaneously test the wiring with different manual testing units, and it need not even be determined in advance which cable core will be checked by which person.

The measure of using the cable to be tested as a communication cable also permits a control signal to be transmitted from the manual testing unit to the testing computer, which will apply an operating voltage to the associated output of the switch cabinet. With the aid of this operating voltage, a function test of motor actuators or relays can then be carried out in addition to the testing of the wiring. In view of the fact that the control signal can be transmitted from the manual testing unit, the person performing the test can also carry out a visual inspection of the motor actuators or relays.

In order to supplement the above, it should additionally be stated that the initial transmission of the identifying signal to the testing computer permits the addresses to be stored together with the associated identifying signals so that, afterwards, it can be checked which cable or which output was tested by which manual testing unit, or rather whether an output was tested at all. On the basis of a list which is to be compiled making use of the data stored, it will then also be possible to check which cable has to be reconnected to which output or input of the switch cabinet.

In accordance with a further development, it will also be advantageous when the switch cabinet control means (DDC, SPS, etc.) is provided with a communication terminal which is adapted to have connected thereto the testing computer, and when the testing computer is constructed such that the signal "tested", which is transmitted by the manual testing unit, will start, upon being received by said testing computer, the reading and storing of a measurements record of the switch cabinet control means. It is thus possible to prepare records of the data measured at the switch cabinet control means during the function test of measuring field units, said data being then compared with values measured at the location of the measuring field unit. In view of the fact that this record is prepared simultaneously with the testing of the cables, the adjustment of the measuring field units can be carried out later on after the end of the whole cable testing at the switch cabinet control means (DDC, SPS, etc.).

BRIEF DESCRIPTION OF DRAWINGS

In the following, the present invention will be explained, by way of example, on the basis of a drawing. The only figure shows, in a schematic representation, a tester according to the present invention during the testing process by means of which the wiring between a switch cabinet 1 and the associated field units 2 to 4 is checked.

DESCRIPTION OF THE PREFERRED EMBODIMENTS

For the sake of clarity, only three field units (cable connections) are shown. However, as can be seen from the explanation following hereinbelow, the present invention can, in principle, be used for an arbitrary number of field units.

The field units 2 to 4 are connected to inputs and outputs 8 to 10 of the switch cabinet 1 via individual cables 5 to 7.

The tester according to the present invention comprises a testing computer 15 provided with a controller whose inputs and outputs are connected via adapters to the cables 8 to 10 in the switch cabinet 1. Furthermore, the testing computer 15 is additionally connected to the control means 13 and 14 of the switch cabinet 1 via a communication line 19. The testing computer 15 is also connected to a protocol printer 20.

Finally, the tester also comprises manual testing units 21 and 21', which are controlled by a microprocessor and which are adapted to be connected to the cables 5 to 7 by means of a test line 22, 22' provided with a clamp. The manual testing unit comprises a display 23, 23' and, just as the controller of the testing computer 15, a ground earth terminal 24, 24'.

The testing computer 15 comprises, in addition to a commercially available personal computer used as a host computer, a controller module which consists of an 8051 microcontroller, a 32 kByte EPROM, a 5 kByte RAM, two serial interfaces, an FSK modem and the bus control logic, this being not shown in detail in the drawing. The controller module has connected thereto various input and output modules which are provided with the necessary hardware for carrying out the tests, viz.: direct-current sources, modem cable adapters, a current measuring circuit, address decoders and bus adapters. The direct-current source supplies 20 mA. Such an input and output module can be used for testing 16 cables; in a first embodiment of the device, 16 input and output modules of this type can be connected so that a total number of 256 cables can be tested simultaneously. However, the number of cables to be tested is not limited to 256.

The manual testing unit 21, 21' comprises, in addition to the display 23, 23' for effecting an alphanumeric display, a keyboard and a serial interface through which the test line 22, 22' can be connected to the cables 5 to 7. Furthermore, each manual testing unit includes a signal generator for applying an identifying signal (01 and 02, respectively) to the cables 5 to 7 to be tested.

In the following, the method according to the present invention will be explained in detail on the basis of the drawing.

First, the testing computer 15 is connected to the adapter for the terminals 8 to 10 via two ribbon cables 16 and 17 thereof. This can be done with the aid of commercially available terminal strips. The individual outputs of the input and output modules of the testing computer 15 are thus connected to the individual outputs 8 to 10 of the switch cabinet control means. The testing computer 15 is then additionally connected to the control means 13 and 14 of the switch cabinet via the communication line 19.

The individual outputs of the controller of the testing computer have associated therewith digital addresses, e.g. DE 1.1, DA 3.1 and AA 1.3. The outputs of the testing computer are connected via the outputs 8 to 10 of the switch cabinet to the cable cores 5, 6, 7 to be tested.

When the testing computer has been connected and the address association stored, an operator is no longer required at this point, but the operator now approaches, together with the manual testing unit 21, the field units 2 to 4, which are connected to the switch cabinet 1 via the cable cores 5 to 7. A second person may use the manual testing unit 21'.

The manual testing unit 21, 21' is first grounded, whereupon it is connected via the test line 22, 22' to a cable core 7 and 5, respectively, which can be seen from a check list (reference list). The reference list corresponds to the address association stored in the testing computer 15. The manual testing unit 21, 21' now transmits its identifying signal (e.g. 01 for unit 21 and 02 for unit 21') to the testing computer 15. As an answer to this signal, the testing computer will apply to all cable cores 5 to 7 the address associated with the respective output 10 or 8 of the switch cabinet 1, said address being supplemented by the identifying signal 01 and 02, respectively. This means that all cable cores 5 to 7 have applied thereto the supplemented addresses 01/AA 1.3 and 02/DE 1.1.

The address reader of the manual testing units 21 and 21' can, however, only read the address supplemented by the identification (01 and 02, respectively) of its own manual testing unit 21 and 21', respectively, i.e. unit 21 will read the address 01/AA 1.3 and unit 21' will read the address 02/DE 1.1. The address thus read is displayed in the respective display 23 or 23' of the respective manual testing unit 21 or 21'. One person carrying out the test and using the unit 21 will now check off the address AA 1.3 on the reference list or, if necessary, he will enter the wrong address in the list. The person using the second unit 21' will take the same course of action with respect to the address DE 1.1.

Due to the identifying signal 01 or 02 sent by the manual testing unit 21 or 21', a pulse is transmitted to the testing computer 15 when the test line 22 or 22' is connected to the cable cores 7 and 5, respectively, said pulse associating the identification 01 with the address AA 1.3 and the identification 02 with the address DE 1.1 in a memory of said testing computer. This association will show later on that the respective output 10 or 8 of the switch cabinet was tested and it will also make known the person by whom it was tested.

The test system can also be used for carrying out a function test. For this purpose, both manual testing units 21, 21' are equipped with a second signal generator by means of which a control signal can be transmitted to the testing computer.

Upon testing the field unit 4, the following course of action is, for example, taken: the manual testing unit 21 is used for transmitting a control signal to the testing computer 15, which will apply an operating voltage to the output 10 of the switch cabinet 1. The person carrying out the test can thus find out, by simple visual inspection, whether the motor actuator 4 actually moves the valve into the open or closed position; this should be the case if the output 10 with the address AA 1.3 has an operating voltage applied thereto. The function test of the sensors, e.g. of the temperature sensor 2, is carried out as follows: when the manual testing unit 21' transmits a control signal through the second signal generator to the testing computer 15, a routine will be started there by means of which a measurements record will be interrogated via a line extending from the switch cabinet. In this measurements record, the temperature measured at the switch cabinet with the aid of the temperature sensor 2 is recorded, among other values, said temperature being recorded together with the time at which the measurement was carried out. The person carrying out the test now measures the temperature at the location of the temperature sensor 2 by means of a hand thermometer and enters this value together with the time in the record. The cable core 5 can be tested in an analogous manner.

The term field unit is not limited to sensors and motors alone, but it may also refer to switch cabinets or to wiring cabinets.

The term list need not necessarily be interpreted such that the list in question is made of paper, but the data to be compared can be stored on all conventional data carriers, e.g. also in the memory of a computer. The manual testing unit 21 can, of course, also be provided with a memory so that the person carrying out the test can store the actual-address list in the manual testing unit and need not write it by hand.

When the testing of the cables has been finished, wiring and offset operations can be carried out, if necessary, by the person carrying out the test on the basis of the check list.

Another possibility of reducing the costs would be the following course of action: the clamping operations in the switch cabinet are carried out first, whereupon the testing computer 15 is connected, and, subsequently, connection of the field units 2 to 4 is started, the correct association of the cable cores and cables being checked by means of the manual testing unit 21 prior to each connection operation. A subsequent test can thus be dispensed with completely.

I claim:

1. A method for testing individual wires of a plurality of wires extending between a plurality of connection terminals in a switch cabinet and a plurality of field units installed at a remote location, the method comprising:

designating a digital address for each connection terminal in the switch cabinet;

associating the digital addresses with the respective field units in a reference list;

attaching at least one manual testing unit to one of the wires near or at one of the field units, thereby grounding the wire;

applying an identifying signal to one of the wires that is indicative of the manual testing unit such that a combination signal representing the identifying signal and the digital address of the respective field unit is transmitted through at least one the connection terminals in the switch cabinet; and testing said one of the wires to determine if the combination signal received by the manual testing unit includes the digital address listed in the reference list for the respective field unit and the identifying signal for the respective manual testing unit.

2. The method of claim 1 wherein at least one of the field units is a working field unit, the method further comprising the step of applying an operating voltage to the working field unit via the respective wire to cause the working field unit to assume a predetermined working condition, thereby testing operation of the working field unit.

3. The method of claim 1 wherein at least one of the field units is a measuring field unit that measures a physical quantity, the method further comprising the steps of measuring a reference physical quantity at the location of the measuring field unit and comparing the reference physical quantity with the physical quantity measured and recorded by the measuring field unit to test operation of the measuring field unit.

4. An apparatus for testing individual wires of a plurality of wires extending between a plurality of connection terminals in a switch cabinet and a plurality of field units installed at a remote location, the apparatus comprising:

a testing computer having a plurality of digitally addressable outputs each associated with one of the connection terminals of the switch cabinet, thereby corresponding to the wire and the field unit connected to the respective connection terminal;

at least one manual testing unit having a microprocessor for controlling the manual testing unit, a signal generator for generating an identifying signal indicative of the manual testing unit and a grounding key for applying a combination signal to one of the wires, the combination signal including the identifying signal and the digitally addressable output associated with the respective wire; and wherein the testing computer includes a memory for storing the combination signal, the manual testing unit further comprising an address reader for reading only the combination signals that include the identifying signal for that manual testing unit.

5. The apparatus of claim 4 further comprising a plurality of manual testing units each having a respective identifying signal indicative of that manual testing unit only, the testing computer transmitting each identifying signal to all of the terminal connections of the switch cabinet.

6. The apparatus of claim 4 wherein the manual testing unit further includes a second signal generator for generating a control signal and a test key for actuating the second signal generator, the testing computer applying an operating voltage to the associate terminal connection in response to the control signal.

7. The apparatus of claim 4 wherein the switch cabinet includes a communication terminal connected to the testing computer, the testing computer having means for reading and storing a measurement record from the manual testing unit.

8. A method for testing individual wires of a plurality of wires extending between a plurality of connection terminals in a switch cabinet and a plurality of field units installed at a remote location, the method comprising:

designating a digital address for each connection terminal in the switch cabinet;

associating the digital addresses with the respective field units;

attaching a manual testing unit to one of the wires near or at one of the field units, thereby grounding the wire;

applying an identifying signal to said one of the wires wire that is indicative of the manual testing unit; and testing said one of the wires to determine if the manual testing unit receives the digital address associated with the respective field unit and the identifying signal for the respective manual testing unit.

9. The method of claim 8 further comprising:

attaching a second manual testing unit to another of the wires near or at another of the field units;

applying a second identifying signal to said another of the wires that is indicative of the second manual testing unit, the first and second identifying signals being transmitted through all of the connection terminals in the switch cabinet;

testing said another of the wires to determine if the second manual testing unit receives the digital address associated with the respective field unit and the identifying signal for the second manual testing unit; and whereby the first manual testing unit disregards the second identifying signal and the second manual testing unit disregards the first identifying signal.

* * * * *